United States Patent
Adamski et al.

(10) Patent No.: US 8,987,792 B2
(45) Date of Patent: Mar. 24, 2015

(54) MERGED ACTIVE DEVICES ON A COMMON SUBSTRATE

(71) Applicant: Peregrine Semiconductor Corporation, San Diego, CA (US)

(72) Inventors: Jaroslaw Adamski, Streamwood, IL (US); Chris Olson, Chicago, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 7 days.

(21) Appl. No.: 13/826,566

(22) Filed: Mar. 14, 2013

(65) Prior Publication Data

US 2014/0264625 A1   Sep. 18, 2014

(51) Int. Cl.

| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 27/088* | (2006.01) |
| *H01L 21/8234* | (2006.01) |
| *H01L 21/8238* | (2006.01) |

(52) U.S. Cl.
CPC ...... *H01L 27/088* (2013.01); *H01L 21/823425* (2013.01); *H01L 21/823437* (2013.01); *H01L 21/823462* (2013.01); *H01L 21/82385* (2013.01); *H01L 21/823857* (2013.01)
USPC .... 257/288; 257/277; 257/322; 257/E21.027; 257/E21.042; 257/E21.051; 257/E21.068; 257/E21.061; 257/E21.37; 257/E21.4; 257/E21.421; 257/E21.632

(58) Field of Classification Search
USPC ......... 257/288, 277, 322, 341, 274, 192, 401, 257/E21.027, E21.042, E21.051, E21.058, 257/E21.061, E21.37, E21.4, E21.421, 257/E21.632
See application file for complete search history.

(56) References Cited

U.S. PATENT DOCUMENTS

| | | | |
|---|---|---|---|
| 4,651,409 A | 3/1987 | Ellsworth et al. | |
| 5,920,486 A * | 7/1999 | Beahm et al. | 716/102 |
| 6,804,502 B2 | 10/2004 | Burgener et al. | |
| 7,248,120 B2 | 7/2007 | Burgener et al. | |
| 7,910,993 B2 | 3/2011 | Brindle et al. | |
| 8,487,706 B2 | 7/2013 | Li et al. | |
| 2011/0181360 A1 | 7/2011 | Li et al. | |

OTHER PUBLICATIONS

Jeong, J. et al. "A 20 dBm Linear RF Power Amplifier Using Stacked Silicon-on-Sapphire MOSFETs." IEEE Microwave and Wireless Compenents Letters, vol. 16 (12), Dec. 2006, pp. 684-686.
Apostolidou, M. et al. "A 65nm CMOS 30dBm Class-E RF Power Amplifier with 60% Power Added Efficiency." IEEE Radio Frequency Integrated Circuits Symposium, 2008, pp. 141-144.

* cited by examiner

*Primary Examiner* — David Nhu
(74) *Attorney, Agent, or Firm* — Jaquez Land Richman LLP; Martin J. Jaquez, Esq.; Alessandro Steinfl, Esq.

(57) ABSTRACT

Merged active devices on a common substrate are presented. Methods for operating and fabricating such merged active devices are also presented.

16 Claims, 15 Drawing Sheets

MERGED ACTIVE DEVICES ON A COMMON SUBSTRATE

BACKGROUND

1. Field

The present disclosure relates to semiconductor devices. More particularly, the present disclosure relates to merged active devices on a common substrate.

2. Description of Related Art

In some applications, an available supply voltage, such as a battery, can exceed voltage handling capacity of a single device. Applying such excessive voltage can cause permanent damage to the device. Stacked devices offer one potential solution to the problem of excessive voltage. Challenges in regards to voltage handling capacity of a single device are imposed in circuit design. For example, in radio frequency (RF) power amplifier design, efficiency and cost often dictate use of stacked devices in RF power amplifiers in view of available battery voltage combined with need to achieve a specified output power from the RF power amplifiers.

SUMMARY

According to a first aspect of the present disclosure, an arrangement is provided, comprising: a plurality of gates corresponding to stacked devices, wherein the stacked devices are stacked across an active area common to the plurality of gates; a plurality of conducting channels formed, during operation of the arrangement, underneath each gate from among the plurality of gates; a first source contact in correspondence of a first gate from among the plurality of gates; a last drain contact in correspondence of a last gate from among the plurality of gates; a first drain side of the active area in correspondence of the first gate; a last source side of the active area in correspondence of the last gate; and one or more drain sides and one or more source sides of the active area, wherein each drain side and each source side is in correspondence of each gate other than the first gate and the last gate, and wherein contiguous regions of the active area comprise drain sides and source sides in correspondence of adjacent gates, wherein, during operation of the arrangement, current is adapted to travel through the contiguous regions of the active area comprised of drain sides and source sides in correspondence of adjacent gates as well as through the conducting channels formed underneath each of corresponding gates overlapping the active area, and wherein at least one of the stacked devices is different from the other stacked devices.

According to a second aspect of the present disclosure, an arrangement is provided, comprising: a plurality of gates corresponding to stacked devices, wherein the stacked devices are stacked across an active area common to the plurality of gates; a first source contact in correspondence of a first gate from among the plurality of gates; a last drain contact in correspondence of a last gate from among the plurality of gates; a first drain side of the active area in correspondence of the first gate; a last source side of the active in correspondence of the last gate; and one or more drain sides and one or more source sides of the active area, wherein each drain side and each source side is in correspondence of each gate other than the first gate and the last gate, and wherein contiguous regions of the active area comprise drain sides and source sides in correspondence of adjacent gates, wherein at least one of the stacked devices is different from the other stacked devices.

According to a third aspect of the present disclosure, an arrangement is provided, comprising: a plurality of N gates corresponding to stacked devices, wherein the stacked devices are stacked across an active area common to the plurality of N gates, wherein N represents an integer, at least one of the stacked devices being different from the other stacked devices; a first source contact in correspondence of a first gate $G_1$ from among the plurality of N gates; and a last drain contact in correspondence of a last gate $G_N$ from among the plurality of N gates, wherein, during operation of the arrangement, current travels between each of the plurality of gates through regions that are located between gates $G_1$ and $G_2, \ldots,$ and between gates $G_{N-1}$ and $G_N$, of the active area common to the plurality of N gates.

According to a fourth aspect of the present disclosure, a method is provided, comprising: providing a plurality of gates corresponding to stacked devices, wherein the stacked devices are stacked across an active area common to the plurality of gates, at least one of the stacked devices being different from the other stacked devices; providing a plurality of conducting channels formed underneath each gate from among the plurality of gates; providing a first source contact in correspondence of a first gate from among the plurality of gates; providing a last drain contact in correspondence of a last gate from among the plurality of gates; providing a first drain side of the active area in correspondence of the first gate; providing a last source side of the active area in correspondence of the last gate; providing one or more drain sides and one or more source sides of the active area, wherein each drain side and each source side is in correspondence of each gate other than the first gate and the last gate, and wherein contiguous regions of the active area comprise drain sides and source sides in correspondence of adjacent gates; and applying an input signal to the first gate and a DC bias between the last drain contact and the first source contact in a manner such that current travels through the contiguous regions of the active area comprised of drain sides and source sides in correspondence of adjacent gates as well as through the conducting channels formed underneath each of corresponding gates overlapping the active area.

According to a fifth aspect of the present disclosure, a method is provided comprising providing a plurality of gates corresponding to stacked devices, wherein the stacked devices are stacked across an active area common to the plurality of gates, at least one of the stacked devices being different from the other stacked devices; providing a first source contact in correspondence of a first gate from among the plurality of gates; providing a last drain contact in correspondence of a last gate from among the plurality of gates; providing a first drain side of the active area in correspondence of the first gate; providing a last source side of the active in correspondence of the last gate; and providing one or more drain sides and one or more source sides of the active area, wherein each drain side and each source side is in correspondence of each gate other than the first gate and the last gate, and wherein contiguous regions of the active area comprise drain sides and source sides in correspondence of adjacent gates.

According to a sixth aspect, a method is provided, comprising: providing a plurality of N gates corresponding to stacked devices which are stacked across an active area common to the plurality of N gates, wherein N represents an integer, at least one of the stacked devices being different from the other stacked devices; providing a first source contact in correspondence of a first gate $G_1$ from among the plurality of N gates; providing a last drain contact in correspondence of a last gate $G_N$ from among the plurality of N gates; and applying an input signal to the first gate $G_1$ and a DC bias between a last drain contact in correspondence of the last gate $G_N$ and a first source contact in correspondence of the first gate $G_1$ in a manner such that current travels between each of the plurality of gates through regions, which are located between gates $G_1$ and $G_2$, ..., and between gates $G_{N-1}$ and $G_N$, of the active area common to the plurality of N gates.

Further aspects of the disclosure are provided in the specification, drawings and claims of the present application.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure. Like reference numerals indicate corresponding parts in the various figures.

DETAILED DESCRIPTION OF EXAMPLE EMBODIMENTS

Figure 1:
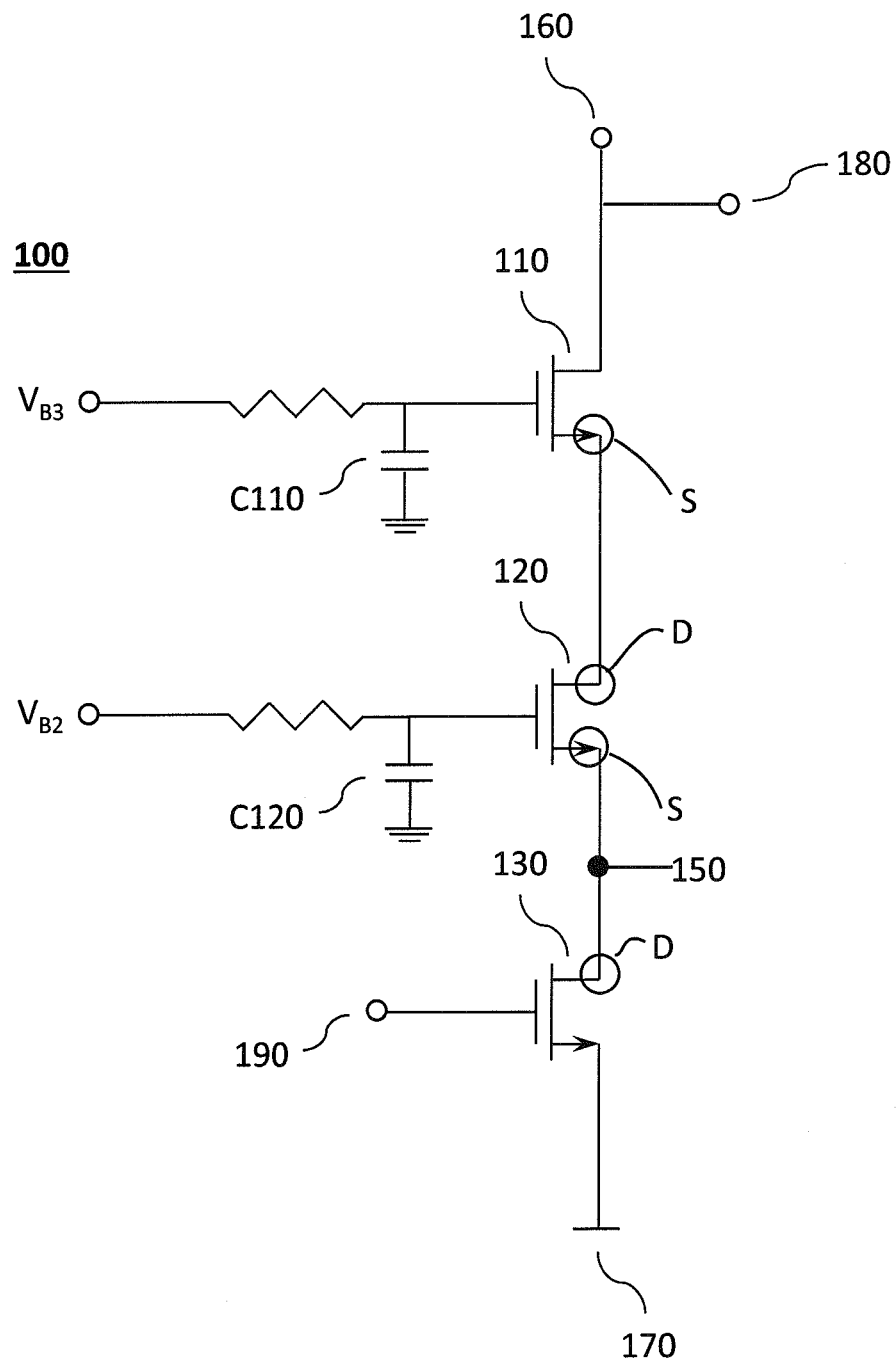
FIG. 1 shows a schematic diagram of a power amplifier structure that comprises a plurality of stacked devices.

As used in the present disclosure, the term "normal device" may refer to a device with a non-zero threshold voltage.

As used in the present disclosure, the term "native device" or "intrinsic device" may refer to a device with a threshold voltage equal to zero or which is not significantly different from zero.

As used in the present disclosure, the term "efficiency" can refer to a measure of how well a device converts one energy source to another. In a case of an NMOS device configured as a power amplifier and operating at radio frequencies (RF), efficiency of the NMOS device is a metric that quantifies conversion of direct current (DC) power that is input to a drain of the NMOS device to RF power that is output from the drain of the NMOS device. Such efficiency may also be referred to as drain efficiency of the NMOS device. The portion of input power which is not provided to the output is a loss, or loss of power. This loss of power is typically the result of heat dissipated within the amplifier's electronic components.

As is well known, device characteristics, such as threshold voltage, of any given device are subject to process variations. For example, for a native device, in view of process variations, threshold voltages within a range about the nominal threshold voltage value of 0 V can still be considered a "native device". An example tolerance for a native device is +/− 150 mV, so that a device within the range of −150 mV and +150 mV can still be considered a native device. As known by a person skilled in the art, circuits are designed with consideration to process variations and tolerances for devices comprising the circuit.

Various embodiments of the present disclosure can be implemented through NMOS and/or PMOS devices of all thresholds. An exemplary semiconductor process can include one or more of the following types of MOS field effect transistor (FET) types. Example NMOSFETs include regular N (RN) FETs that have a nominal threshold voltage of 450 mV, high doping N (HN) FETs that have a nominal threshold voltage of 700 mV, and intrinsic N (IN) FETs that may have a threshold voltage of approximately 0 V. Corresponding PMOSFETs include regular P FETs (RP) that have a nominal threshold voltage of −400 mV, high doping FETs (HP) that have a nominal threshold voltage of −600 mV, and intrinsic P (IP) FETs that may have a threshold voltage of approximately 0 V. In another semiconductor process, EIN, RN, HP, and RP FETs may have threshold voltages of 800 mV, 300 mV, −800 mV, and −300 mV, respectively. In the present disclosure, IN and IP are referred to as "native devices" whereas HN, RN, HP, and RP are referred to as "normal devices". Details in a circuit are specific to a particular semiconductor process utilized, but the skilled person can adjust details to fit different semiconductor processes.

Stacked devices are discussed in detail in United States Patent Application Publication No. 2011/0181360, "Stacked Linear Power Amplifier With Capacitor Feedback and Resistor Isolation", by Li et al., published Jul. 28, 2011, incorporated by reference herein in its entirety. Stacked devices are also discussed in detail in U.S. Pat. No. 7,248,120 B2 "Stacked Transistor Method and Apparatus", by Burgener at al., published Jul. 24, 2007, incorporated by reference herein in its entirety. Stacked devices can be used in applications where devices may need to be able to tolerate a voltage that exceeds the voltage handling capability of one device. For example, in a field effect transistor (FET) device, voltage handling capability can be provided by maximum drain to source voltage $V_{ds}$ possible without the FET breaking down. By properly stacking the devices and biasing the FETs, it is possible to switch or amplify voltages that exceed the voltage handling capability of a single device.

By way of example and not of limitation, a supply voltage to a cellular handset RF power amplifier is typically about 3.6 V, and a typical 0.25 μm CMOS (complementary metal oxide semiconductor) transistor can handle around 2.5 to 3.0 V of drain to source voltage $V_{ds}$. In such a case, the supply voltage exceeds the voltage handling capability of the transistor. By stacking two or more transistors together, the supply voltage can be shared between the transistor devices and kept within voltage operating limits of the transistor devices. Furthermore, the effect of inductive loads and resonant circuits present in an RF power amplifier or associated with the RF power amplifier can often result in a maximum voltage swing at an output of the RF power amplifier that exceeds the supply voltage by up to several times the value of the supply voltage. The possibility of this large maximum voltage swing makes the stacking of devices even more desirable in order to handle the increased voltage swing.

While the embodiments of merged active devices on a common substrate set forth in the following discussion utilize n-channel or NMOS devices as the active devices, the person skilled in the art will understand that merged active devices on a common substrate of the present disclosure can also be constructed using p-channel or PMOS devices with a corresponding reversal of drain and source contacts along with reversal of polarity of any non-zero threshold voltage $V_t$ (e.g. $V_t$=0.7 V for NMOS device becomes $V_t$=−0.7 V for PMOS device) for enhancement type devices. It is noted that in the various figures of the present disclosure, transistor terminals of gate, drain, and source are labeled with "G", "D", and "S", respectively.

FIG. 1 shows a schematic diagram of a power amplifier structure (100) that comprises a plurality of stacked devices, such as devices (110, 120, and 130). A voltage supply $V_{DD}$ to the stacked devices can be provided through a voltage supply node (160) to a drain of the topmost device (110). The bottommost device (130) can be, but need not be, connected to ground. The power amplifier structure (100) can provide an output at node (180). Bias networks for devices (110) and (120) can be comprised of resistors and capacitors (C110, C120). The resistors provide a DC bias for the devices (110, 120) and isolate the bias networks from RF voltage swing present at the gate of devices (110, 120). Node (150) joins the drain of device (130) and the source of device (120) and can provide access to the structure (100) at this node (150).

The power amplifier structure (100) shown in FIG. 1 can be a final stage or an intermediate stage, such as a driver to a subsequent (possibly final) stage. For example, in a case where the power amplifier structure (100) of FIG. 1 shows an intermediate stage, the output node (180) of the power amplifier structure (100) can be coupled to a subsequent stage (e.g. a gate of a device in the subsequent stage). Furthermore, input provided to a node (190) of the power amplifier structure (100) can be an output of a preceding power amplifier stage.

Although a power amplifier structure (100) is shown in FIG. 1, such a structure involving a plurality of stacked devices can be utilized in other applications like switching amplifier structures. When the plurality of stacked devices comprise a switching amplifier structure, nodes (160) and (170) can represent two RF terminals.

For discussion purposes, arrangements depicting three active devices, such as devices (110, 120, and 130) shown in FIG. 1, are depicted and described throughout the present disclosure. However, although several embodiments of the present disclosure comprise three active devices, teachings of the present disclosure may also be extended to structures comprising two active devices as well as four or more active devices. Furthermore, for purposes of discussion purposes only, the active devices are generally used in a power amplifier structure, such as that shown in FIG. 1. However, embodiments of the present disclosure can also be utilized in other structures such as switching amplifier structures.

Figure 2:
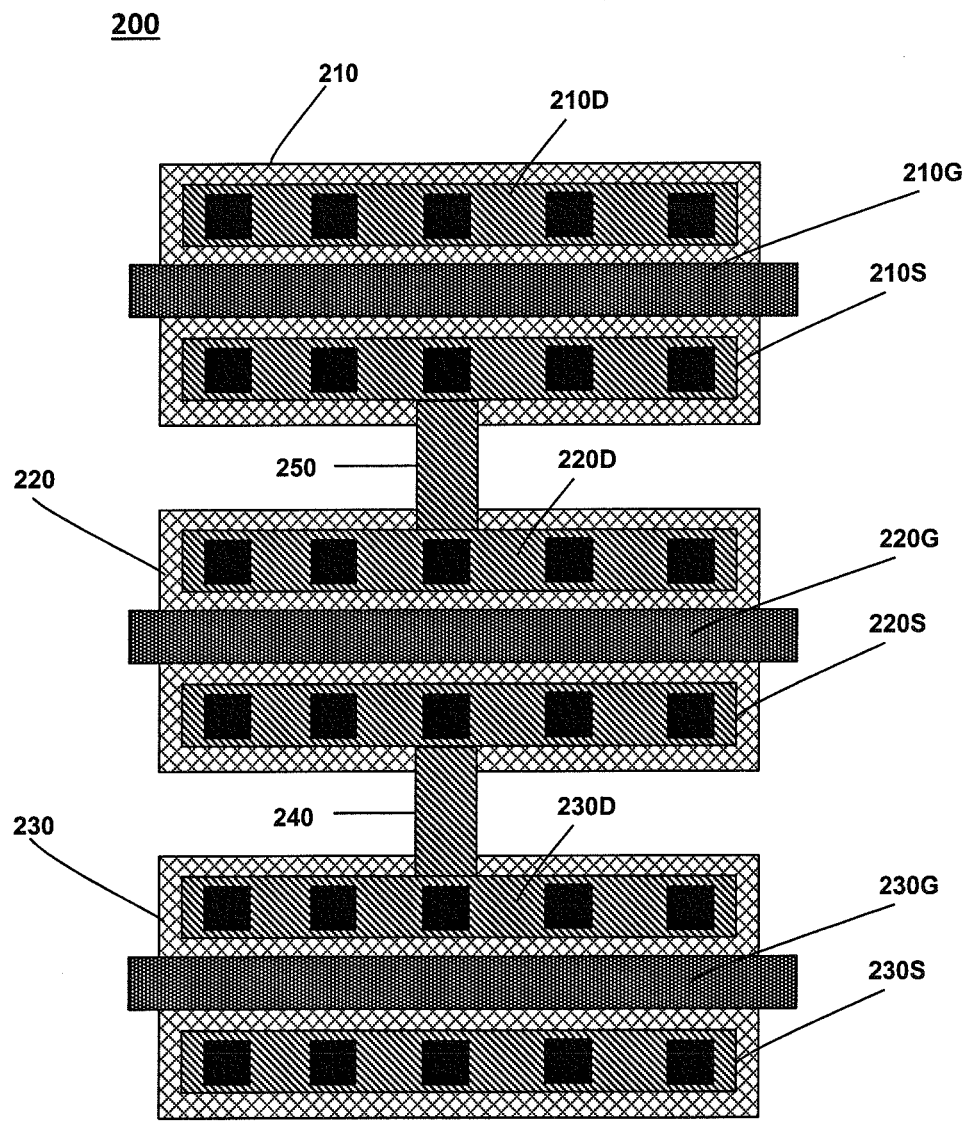
FIG. 2 shows a semiconductor implementation of active devices of a structure of the type shown in FIG. 1.

FIG. 2 shows a semiconductor implementation of active devices of a structure of the type shown in FIG. 1. A structure (200) can comprise semiconductor active areas (210, 220, and 230), where each semiconductor active area includes a respective gate area (210G, 220G, and 230G) and respective source and drain contacts or metallizations (210S, 210D, 220S, 220D, 230S, and 230D). By way of example, semiconductor active areas can be areas where a local oxidation of silicon (LOCOS) layer has been removed, thus providing areas that can be dedicated for construction of active devices with their drain, source, and gate areas.

Each of the gate areas (210G, 220G, and 230G) shown can comprise a polysilicon gate (conducting layer) and a gate oxide area sandwiched beneath the polysilicon gate and above the semiconductor active area. The polysilicon gate can cover the gate oxide over the active areas (210, 220, and 230) where the LOCOS was removed. Connection to the polysilicon gate can be done on the LOCOS area outside the gate oxide. This can be accomplished with a first metal layer and a via or contact (metal to polysilicon). Solid black squares (e.g. solid black squares in the drain terminal (210D)) in FIG. 2 represent contacts to the semiconductor drain and source areas. Such contacts can connect metal straps with the semiconductor areas of drain and source.

Apart from the gate regions (210G, 220G, and 230G), access to the structure (200) is usually required only with respect to the bottom source contact (230S) and the top drain contact (210D). Therefore, in many cases, presence of metal straps (240, 250), which are utilized to establish an electrical contact between the devices of the stack, generally does not provide additional utility to the structure (200) and instead enlarges real estate occupied by the structure (200). Furthermore, metal straps (240, 250) have resistances and yield loss due to current flow through the metal straps (240, 250).

Figure 3A:
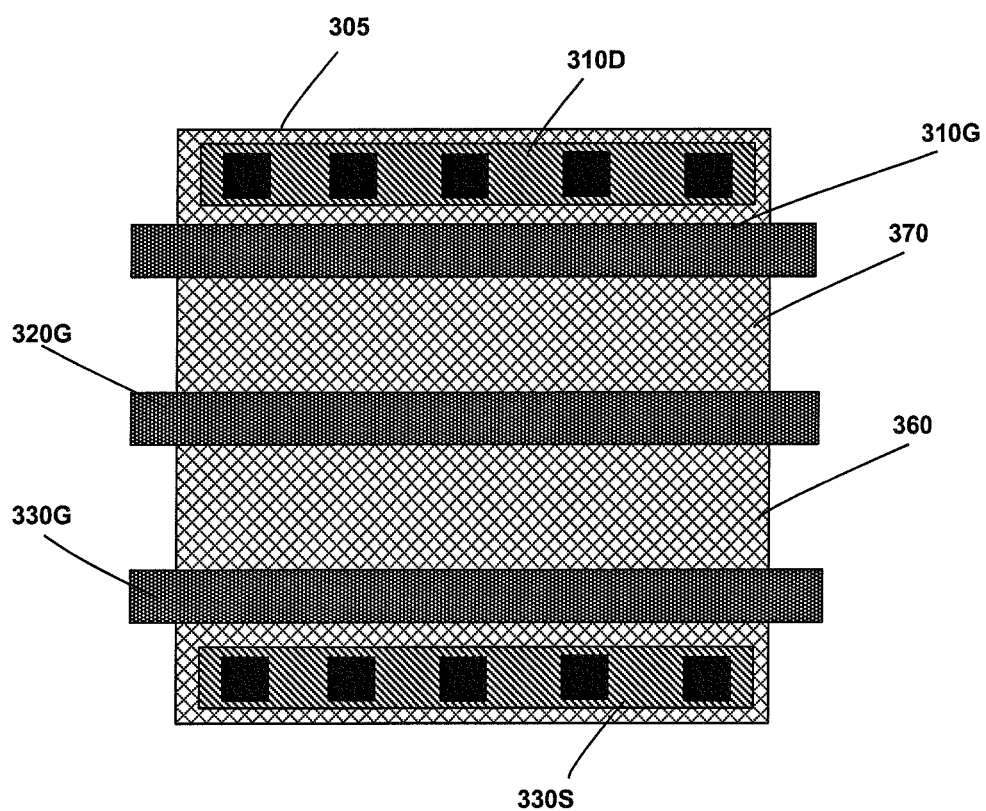
FIG. 3A shows a merged active device structure, which includes a single active area comprising a plurality of gate areas, a bottom source contact, and a top drain contact.

FIG. 3A shows a merged active device structure (300), which includes a single active area (305) comprising a plurality of gate areas (310G, 320G, 330G), a bottom source contact (330S), and a top drain contact (310D). Each of the gate areas (310G, 320G, and 330G) shown can comprise a polysilicon gate (conducting layer) and a gate oxide area sandwiched beneath the polysilicon gate and above the semiconductor active area. The following discussion makes reference to FIGS. 1, 2, and 3A. The merged active device structure (300) shown in FIG. 3A can be built without metal straps, such as metal straps (240, 250) shown in FIG. 2, by merging adjacent drain and source connections of adjacent devices. As previously mentioned, metal straps have resistance and yield loss as well as add to real estate.

In such a merged active device structure (300), the source region of device (110) can now be referred to as a source side (portion of region 370 adjacent to gate 310G) and can be merged with the drain region of device (120), where said drain region can now be referred to as a drain side (portion of region 370 adjacent to gate 320G), while the source region of device (120), which can now be referred to as a source side, is merged with the drain region of device (130), which can now be referred to as a drain side. In other words, in the intermediate stages, the current can travel directly through active semiconductor regions (360, 370).

Another way of interpreting this embodiment is that active semiconductor region (370) comprises the source side in correspondence of gate (310G) and the drain side in correspondence of gate (320G), while active semiconductor region (360) comprises the source side in correspondence of gate (320G) and the drain side in correspondence of gate (330G). Savings in terms of material and space occupied by the merged active device structure (300) are self-evident. Additionally, parasitic capacitance effect due to a presence of metal straps, such as those shown in FIG. 2, is absent.

Moreover, if desired, dimensions of regions (360, 370) can be reduced to further reduce parasitic capacitances, compatibly with resistance requirements of the structure. Specifically, the active area of regions (370) and (360) has a finite resistance, where a longer path from one gate area to a next gate area can result in higher resistance. Reduction of resistance can therefore be achieved by shortening a path the current travels across the semiconductor regions (360) and (370) that comprise the merged drain and source areas.

As used herein, the term "intermediate stage" may refer to a portion of a merged active device structure (e.g. the merged active device structure (300)) between gate areas (e.g. (310G, 330G)) at a top and a bottom of the merged active device structure. As used herein, the term "top" may refer to elements, within a stack of device(s), that are positioned closer to a positive supply voltage and the term "bottom" may refer to elements, within a stack of devices, that are positioned closer to a negative supply voltage or ground.

Furthermore, it is noted that use of the terms "drain side" and "source side" in the present disclosure is an issue of nomenclature and is for convenience only. In particular, for purposes of discussion, current leaves a source of a device and enters a drain of a subsequent device. However, the drain and source sides between two devices is one semiconductor doping area, and consequently there is no physical division between what is referred to as a "drain side" and what is referred to as a "source side".

Figure 3B:
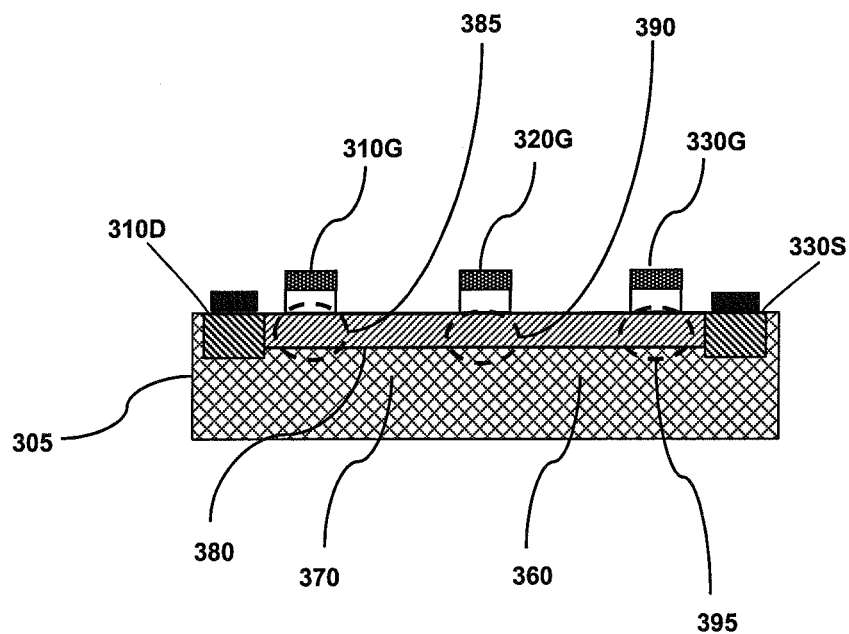
FIG. 3B shows a cross-sectional view of the merged active device structure shown in FIG. 3A.

FIG. 3B shows a cross-sectional view of the merged active device structure (300) shown in FIG. 3A. Inversion layers (385, 390, 395), which serve as conducting channels, can be formed beneath each gate region (310G, 320G, 330G). Regions (370) and (360) can be highly doped and can have good electrical conductivity. A continuous path for current to flow from the top drain contact (310D) through conducting channel (385) underneath gate (310G); through region (370); through conducting channel (390) underneath gate (320G); through region (360); through conducting channel (395) underneath gate (330G); and continuing through to the bottom source contact (330S) can be formed depending on applied gate voltages in relation to threshold voltages, which can be understood clearly by a person skilled in the art. Gate oxides corresponding to each of the gates (310G, 320G, 330G) are shown by white rectangles. Solid black rectangles represent contacts to the semiconductor drain and source areas.

According to an embodiment of the disclosure, stacked devices of a merged active device structure can all be of the same type, e.g. normal NMOS-type devices, where normal NMOS is intended to mean that the device is not a native device (threshold voltage $V_t$=0) and instead has a threshold voltage $V_t$>0, e.g. $V_t$ in the 0.4-0.7 V range. By way of example and not of limitation, a normal NMOS-type device can be fabricated by providing the device with an implant or mask that adjusts the $V_t$ of the device. In contrast, a native NMOS device is also an NMOS type transistor but with threshold voltage at or close to 0 V. NMOS and PMOS transistors can be adjusted for $V_t$ with a low dose, low energy implant. Standard photoresist mask can be used. The devices that need to remain native can be masked to avoid receiving the $V_t$ implants (e.g. implants which would cause $V_t$ to not be close to 0 V). NMOS and PMOS devices are known as such to the person skilled in the art and will not be described here in further detail.

Hybrid Devices—Merging of Devices with Different $V_t$

The present disclosure will make numerous references to hybrid devices, hybrid structures, hybrid configuration, and hybrid factors. As used herein, hybrid factors may refer to attributes of an arrangement, where different active devices within the arrangement may have different values for a certain characteristic, such as threshold voltage or gate dimensions (e.g. length or width of a gate). As used herein, hybrid devices may refer to merged devices characterized by one or more hybrid factors. As used herein, hybrid structures may refer to a structure characterized by one or more hybrid factors. As used herein, hybrid configurations may refer to configurations characterized by one or more hybrid factors. For example, an arrangement comprising stacked transistors that are not merged, where the arrangement is characterized by a hybrid factor, may be referred to as a "hybrid structure". The configuration of such a structure may be referred to as a "hybrid configuration". By way of further example, an arrangement comprising stacked transistors that are merged (e.g. the arrangement shown in FIG. 3A) and are characterized by a hybrid factor may be referred to as a "hybrid device".

Figure 4:
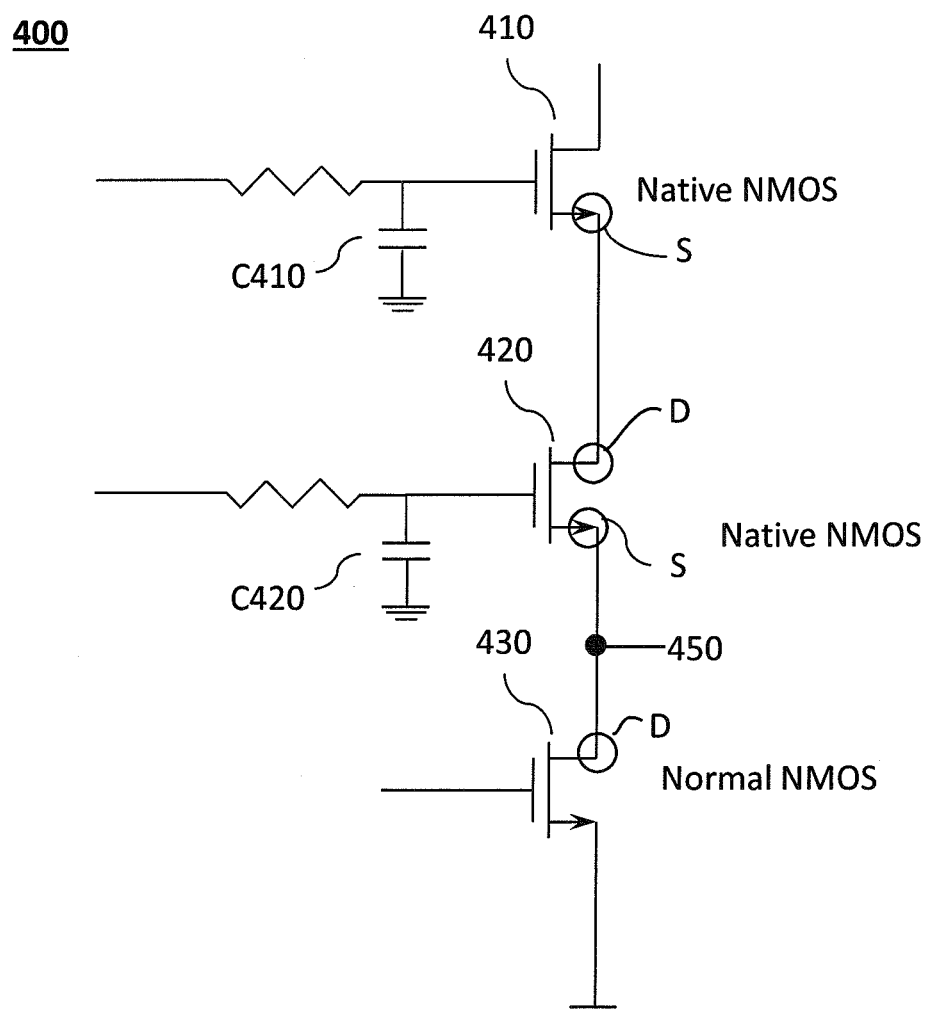
FIG. 4 shows a merged active device structure comprising top native NMOS-type transistors and a bottom NMOS-type transistor.

According to a further embodiment of the present disclosure, a hybrid configuration such as shown in FIG. 4 can be provided, where the stacked devices of the structure are of different types. FIG. 4 shows a merged active device structure (400) comprising top native NMOS-type transistors (410, 420) and a bottom normal NMOS-type transistor (430). By way of example and not of limitation, any number of native NMOS-type devices ($V_t$=0) can be used together with the above mentioned normal NMOS-type devices. In particular, a stack of transistors where the bottom transistor is a normal NMOS-type device and at least one of the top transistors (e.g. all of the remaining transistors in FIG. 4) is a native NMOS-type device can be provided, according to an embodiment of the disclosure.

Alternatively, the structure (400) could be constructed such that transistor (410) is a normal NMOS device and transistors (420, 430) are normal NMOS devices. For stacked (or stacked and merged) device structures comprising more than three active devices, any combination of native and normal NMOS devices may be used, whether interleaving individual native and normal devices or constructing a bottom plurality of devices as either normal or native and constructing a top plurality of devices as either native or normal. Threshold voltages of devices need not be monotonically increasing or decrease.

Figure 5:
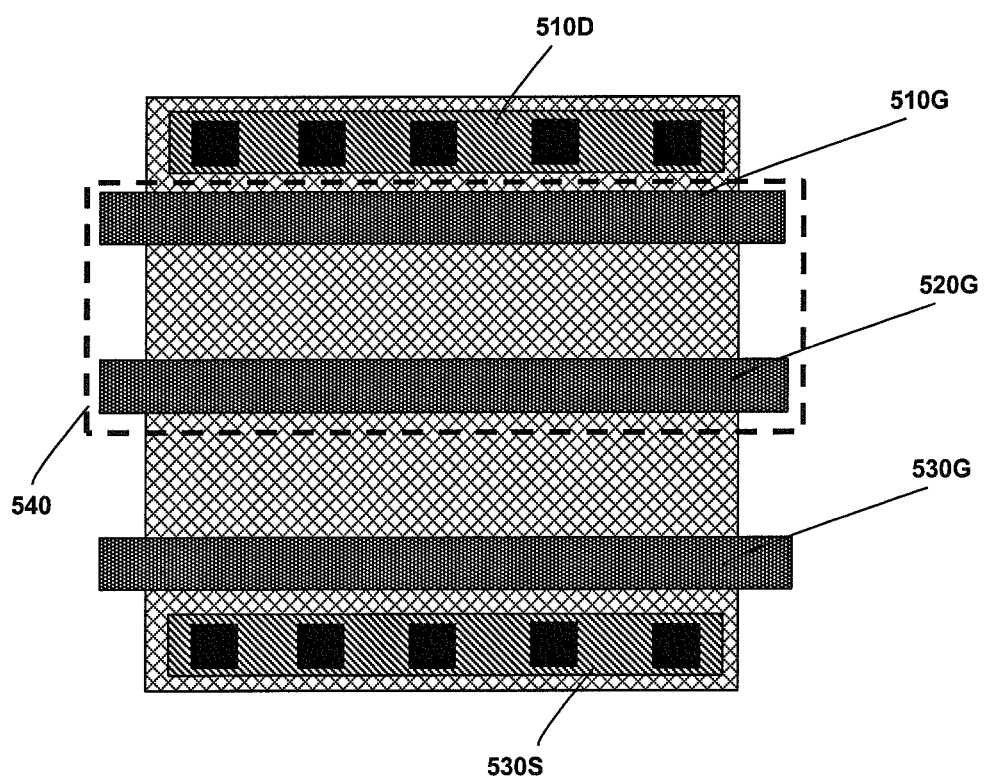
FIG. 5 shows an active area comprising a masking area masking the gates of some of the devices of FIG. 4.

FIG. 5 shows an active area (500) comprising a masking area (540) masking the gates (510G, 520G) of the devices (410, 420) of FIG. 4. The masking area (540) masks the gates (510G, 520G) of the devices (410, 420) of FIG. 4, thus allowing a fabrication process of devices (410, 420) to be different from the fabrication process of device (430). In other words, when an NMOS-type implant is implanted along the active area (500), such implant is not implanted inside the masked area (540), thus creating a desired hybrid threshold voltage implementation. The gates (510G, 520G) under the masking area (540) can remain native because the gates (510G, 520G) do not receive the $V_t$ implant.

According to another embodiment of the disclosure, dose of the implant can be graded across the height of the stack, starting with a high implantation at the devices at the bottom of the stack and lower implantations at the devices at the top of the stack, which can be realized, by way of example and not of limitation, through multiple masking steps. The person skilled in the art will understand how to provide graded implantations through multiple masking steps from the figures and description already presented. It should be noted that a higher degree of implantation on the bottom device may be used in some embodiments, because the bottom device can then be easily turned OFF (thus turning OFF the entire stack) by connecting the gate of the bottom device to its source potential. A way to set $V_{gs}$ to zero is to connect, by way of example, an inverter to the gate contact of the bottom device. Should the bottom device be a native NMOS-type device, the bottom device cannot be turned OFF by setting its $V_{gs}$ to zero. To set Vgs below 0V and turn the device off a generation of a negative voltage would be necessary. A separate power supply or negative voltage generated by a charge pump circuit, that is well known by those skilled in the art, may be used for this purpose.

Figure 6A:
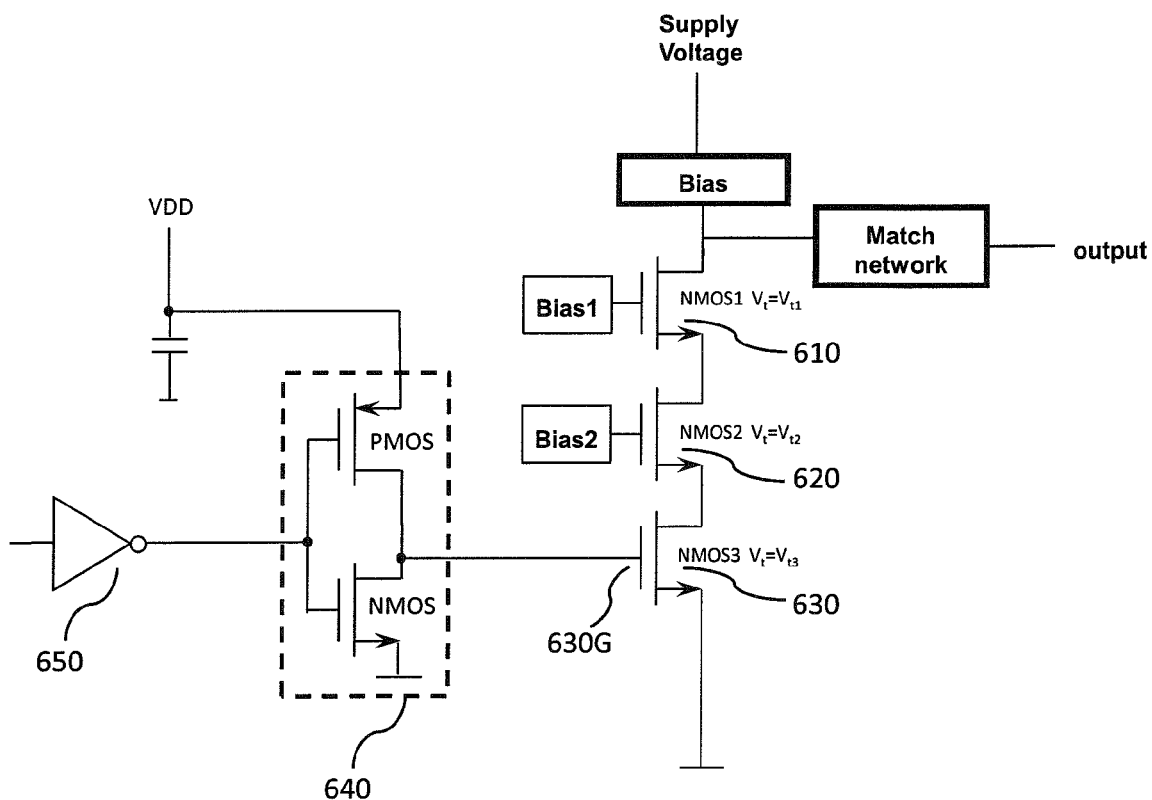
FIGS. 6A and 6B show embodiments of the present disclosure comprising an inverter connected to the gate contact of a bottom device among a stack of devices.

FIG. 6A shows an embodiment of the disclosure comprising an inverter (640) connected to a gate contact (630G) of a bottom device (630). As discussed in the preceding paragraph, such an arrangement allows the bottom device to be easily turned OFF. Inverters (640) and (650) constitute an amplification path that enables a proper driving strength of device (630). For a case of graded threshold voltages, $V_{t3} > V_{t2} > V_{t1}$. For a case of enhancement (normal) NMOS3 device (630) and native NMOS2 (620) and NMOS1 (610) devices, $V_{t3} > V_{t2} = V_{t1}$. Upon reading the present disclosure, a person skilled in the art will also realize that a structure comprised of stacked devices which are not merged, where devices in the stack have different threshold voltages, as described in the preceding paragraphs for a merged device, can also be constructed.

Figure 6B:
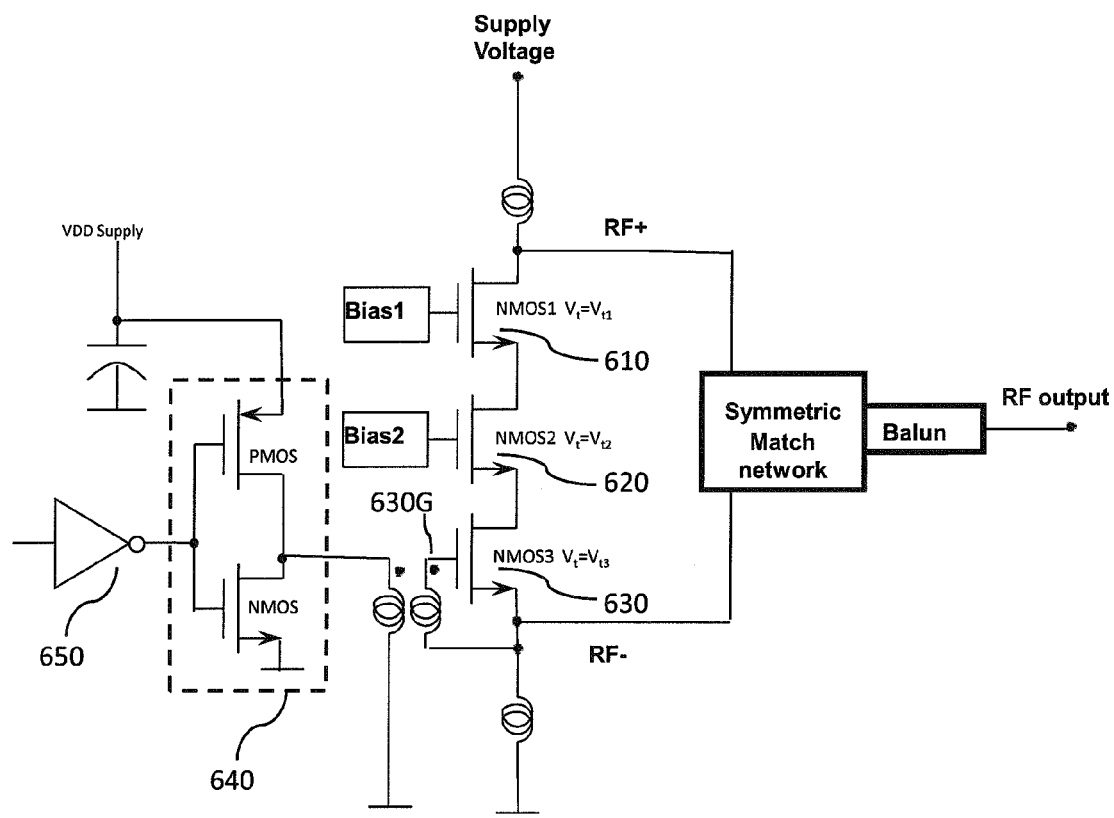

FIG. 6B shows another embodiment of the present disclosure comprising an inverter connected to the gate contact of a bottom device among a stack of devices. In particular, FIG. 6B shows an embodiment where the gate contact (630G) of the bottom device (630) is driven by a transformer (e.g. common-mode choke) which blocks the common-mode currents and passes the differential currents. It is noted that an RF choke is connected to a source of a bottommost device as well as to the drain of the topmost device. The arrangement of FIG. 6B is similar to one in FIG. 6A, the main difference being the amplifier stack in FIG. 6B is configured to operate in a balanced configuration thus decoupling the amplified signal from a common ground. Terminals RF+ and RF− constitute the balanced output which is fed to a symmetrical matching network, followed by a balun network which transforms the balanced output of the amplifier stage to an unbalanced output. Such an arrangement is suited for switching amplifiers wherein amplification of symmetrical signals is typically desired. In accordance with the embodiment of FIG. 6B, it is possible to have the switching devices connected between two nodes without one being a ground connection, such as a symmetrical connection.

Hybrid Devices—Devices with Different Gate Oxide Thickness

The above discussed embodiments with reference to FIGS. 4-6B discuss a hybrid structure comprising devices with different threshold voltages ($V_t$). According to a further embodiment of the disclosure, a hybrid structure comprising devices with different gate oxide thickness can also be provided. As a preliminary consideration, it should be noted that even in the case of identical devices, losses are not necessarily divided equally in the devices of the stack. The highest loss can occur in the bottom device because of the way the bottom device is driven. Usually, for best efficiency, the bottom device should be driven by a square wave, but this would generally involve a high amount of power, comparable to an amount of power to be generated by a final stage of a power amplifier that comprises a merged active device structure. Instead, a waveform that has relatively large rise and fall times can be adopted, such as a waveform that approximates a sine wave in the 2 GHz band. This is one reason why the bottom device can experience the highest amount of loss.

On the other hand, the way power is recirculated in the top devices from the bypass capacitors (see, for example, capacitors (C110) and (C120) of FIG. 1, or capacitors (C410) and (C420) of FIG. 4) back into the devices each time the stack (100) or (400) is turned ON and OFF, can provide for a much lower amount of power loss, given that there is no added power (e.g. no input signal being applied to the transistors (410, 420)). During a first half (charge) of a cycle of oscillation, as the stack (100) or (400) is turned ON beginning with a bottom device (130) or (430), the node (150) or (450) between the drain of a bottom device (130) or (430) and the source of the device (120) or (420) above the bottom device (130) or (430) can be connected to ground. At the same time, current begins to flow from the top of the stack to the bottom of the stack and energy in the storage capacitances (C 110, C 120, C410, C420) can drive the gates of the top devices ON because of stored charge providing a positive $V_{GS}$ to gates of transistors (410, 420). During a second half (discharge) of the cycle of oscillation, as the stack is turned OFF, energy can be stored in bypass capacitors (see, for example, capacitors (C110) and (C120) of FIG. 1, or capacitors (C410) and (C420) of FIG. 4). Such driving is usually rather efficient in terms of resistance and inductance, with very small waveform rise and fall times. Therefore, a combination of biasing factors and design factors (e.g. building such devices as native NMOS-type devices), can make the devices above the bottom device very fast when compared with the bottom device.

In view of the fact that driving of top devices tends to be faster and more efficient than the driving of bottom devices, a further embodiment of the present disclosure involves an asymmetrical $V_{ds}$ voltage division between the devices of the stack, where the bottom device (e.g. 430) is provided with lowest amount of $V_{ds}$ voltage swing, in order to consume less power and be more efficient. By way of example, in an exemplary stack of three devices, the highest $V_{ds}$ voltage swing can be assigned to the top device, the lowest $V_{ds}$ voltage swing to the bottom device, and an intermediate $V_{ds}$ voltage swing can be assigned to the intermediate device. Devices of the stack can be provided with a different $V_{ds}$ voltage by controlling biasing of the various devices of the stack. By way of example only, a particular implementation of a class E amplifier has a peak voltage of 10 V that is divided between three devices as follows: 4 V for top device, 3.5 V for middle device, and 2.5 V for bottom device.

However, as the voltage $V_{ds}$ of a device is increased through biasing, the $V_{dg}$ of that device can become critical. For thin gate oxides, the drain-to-source voltage handling capability may be limited by the drain-to-gate voltage handling capability because, when the device is turned OFF, the entire $V_{ds}$ voltage also exists between the drain and gate terminals. Moreover, the gate voltage is often driven below the source voltage level (for NMOS type devices) to turn the device OFF, and this can result in the $V_{dg}$ voltage exceeding the $V_{ds}$ voltage. Consequently, a thinner gate oxide can result in a larger electrical field across the gate oxide. A device may not be able to tolerate an electrical field across its gate oxide larger than a certain magnitude.

Therefore, in order to avoid such problem, a further way to provide asymmetrical voltage division, in conjunction with or alternative to different biasing of different devices, is to provide gates with different gate oxide thicknesses. In particular, a device with a thicker gate oxide increases both the drain-to-source voltage handling capability $V_{ds}$ and a drain-to-gate voltage handling capability $V_{dg}$. As mentioned in the previous paragraph, a thinner gate oxide can result in a larger electrical field across the gate oxide, which can result in a lower voltage handling capability of the device. Increasing the gate oxide thickness may, therefore, also increase the $V_{ds}$ voltage handling capability, as mentioned above.

Figure 7:
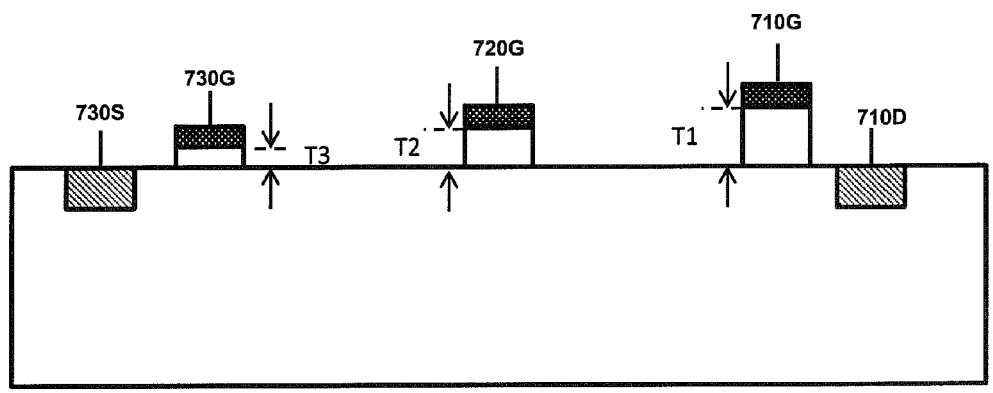
FIG. 7 shows an embodiment of the present disclosure comprising devices with differing gate oxide thicknesses.

FIG. 7 shows an embodiment of the disclosure comprising devices with differing gate oxide thicknesses. Oxide thickness $T_1$ of gate (710G) is larger than oxide thickness $T_2$ of gate (720G) which, in turn, is larger than oxide thickness $T_3$ of gate (730G). The embodiment shown in FIG. 7 allows the three different gates to exhibit different $V_{ds}$ and $V_{dg}$ because of different oxide thicknesses as discussed in the preceding paragraph. It is noted that, depending on application of the devices, oxide thicknesses need not be monotonically increasing or decreasing from bottommost to topmost device. While the embodiments of the above paragraphs have been shown in a separate manner, the person skilled in the art will understand that a combined embodiment is also possible, where a hybrid normal NMOS/native NMOS-type configuration is provided together with a varied gate thickness configuration.

Hybrid Devices—Different Gate Length

Figure 8:
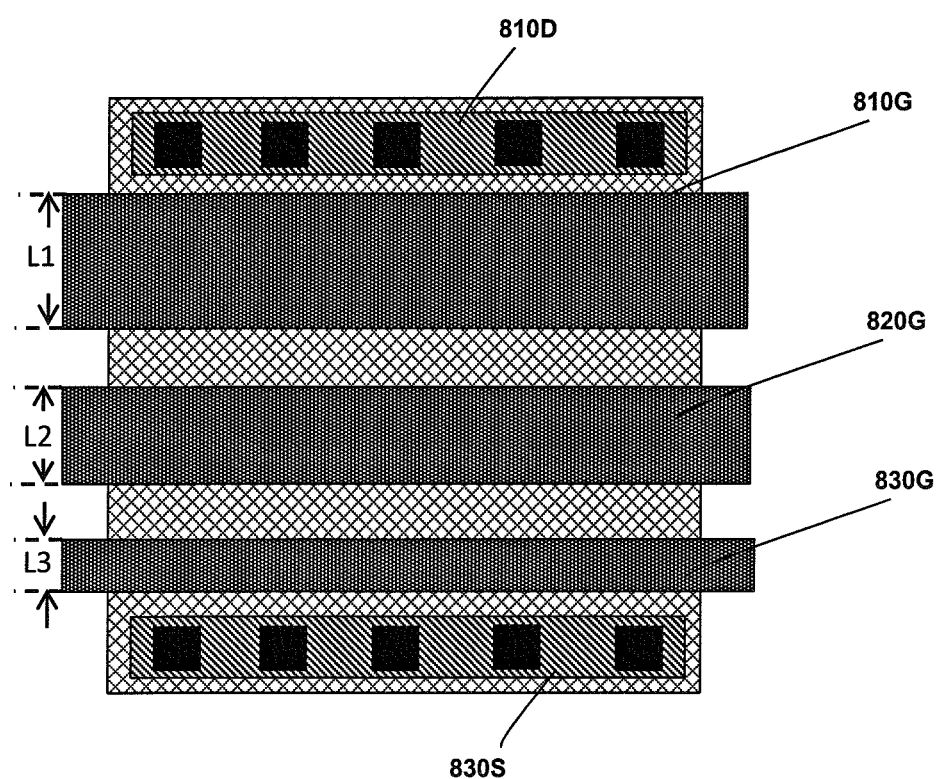
FIG. 8 shows an embodiment of the present disclosure where different gates have different lengths.

An additional embodiment of the present disclosure provides for a merged active device structure with a varied gate length configuration, where gates of the devices of the merged active device structure have different lengths. As used herein, the term "gate length" may be synonymous with device length. FIG. 8 shows an embodiment of the disclosure where different gates have different lengths. Length $L_1$ of gate (810G) is greater than length $L_2$ of gate (820G) which, in turn, is greater than length $L_3$ of gate (830G). Length $L_3$ is set equal to a small (for a given semiconductor fabrication process) gate length for lower "ON" resistance and larger transconductance $g_m$. An example value for a small gate length is 0.25 μm, and such a gate length is the minimum allowable gate length in a typical 0.25 μm CMOS process.

In general, when the merged active device structure shown in FIG. 8 is turned ON, a positive supply voltage is applied to drain terminal (810D) and voltage gradually drops across devices comprising gates (810G, 820G, 830G) until a zero (ground) voltage is present at source terminal (830S). Length $L_2$ is greater than length $L_3$ to improve (increase) allowable drain to source voltage across the device comprising gate (820G) and allow for larger voltage across transistors comprising gates (810G) and (820G). Length $L_1$ can be equal to length $L_2$ (a person skilled in the art will not require an additional diagram to understand such an embodiment) or it can be larger than length $L_2$ (as shown in FIG. 8) to even further increase allowable voltage from drain to source of device comprising gate (810G).

In other embodiments, gate lengths may be adjusted in various other manners. By way of example, and not of limitation, length $L_2$ may be greater than both length $L_1$ and length $L_3$. By way of further example, and not of limitation, length $L_3$ may be greater than length $L_2$, where length $L_2$ is greater than length $L_1$. Numerous adjustments to gate length are possible. Implementation of such embodiments is within the ability of a person skilled in the art.

Similar to some of the embodiments above, a first hybrid configuration could exhibit a top device with a larger gate length, a bottom device with a smaller gate length, and intermediate devices with intermediate gate lengths. Combinations of the various embodiments are also possible. By way of example, and not of limitation, an embodiment where a varied oxide thickness is present can be combined with an embodiment where a varied gate length is present.

Hybrid Devices—Different W/L (Electrical Size)

Figure 9:
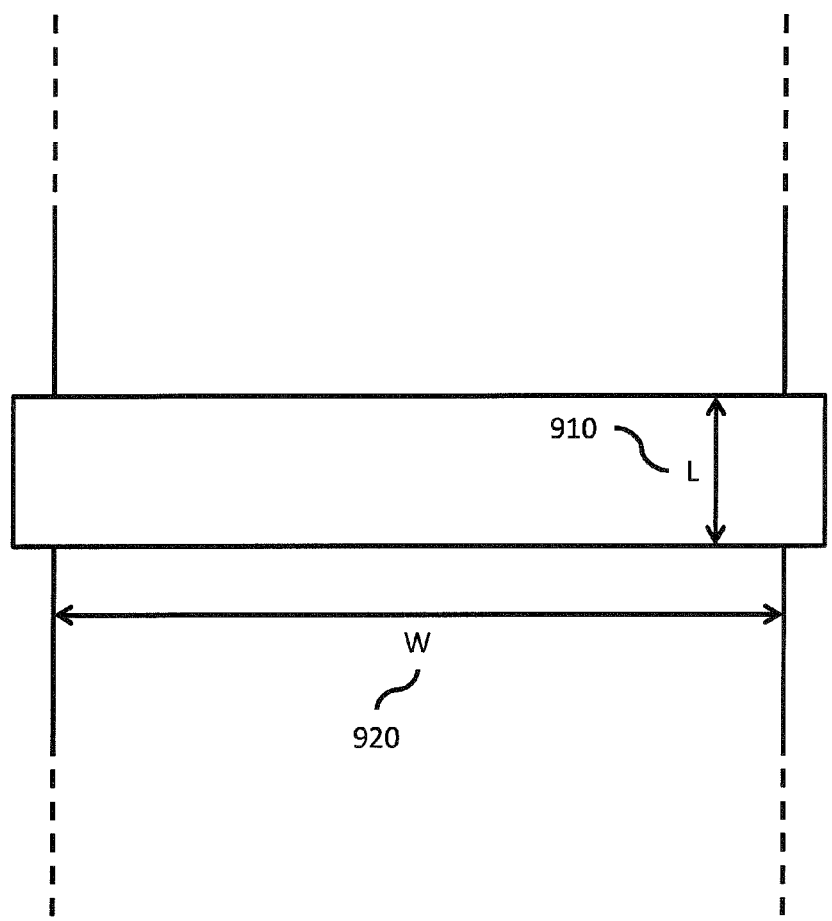
FIG. 9 shows an embodiment of the present disclosure comprising a device with exemplary length L and width W.

FIG. 9 shows an embodiment of the present disclosure comprising a device with exemplary length L (910) and width W (920). According to a further embodiment, a hybrid configuration comprising devices having different W/L electrical sizes, where W/L is a ratio of gate width to gate length, can be provided. The electrical size W/L of a device is linked to its "ON" resistance $R_{on}$ according to the formula $$R_{on} = 1/(\mu_n * C_{ox} * W/L * (V_{gs} - V_t))$$

where:
$\mu_n$ is the effective charge carrier mobility constant ($\mu_p$ for p-channel or PMOS devices),
$C_{ox}$ is the gate capacitance per unit area constant,
W/L is the ratio of gate width to gate length,
$V_{gs}$, is the voltage across gate and source of the device, and
$V_t$ is the threshold voltage of the device.

A bottom device (e.g. transistor (130) in FIG. 1) of a stack (e.g. circuit (100) in FIG. 1) can consume a high amount of electrical power, which is then lost during the discharge in a case where the bottom device is tied to ground. As used previously herein, the term "discharge" may refer to the second half of a cycle of oscillation during which the stack is turned OFF. As used previously herein, the term "charge" may refer to the first half of a cycle of oscillation during which the stack is turned ON. Due to the driving configuration of the bottom device (e.g. as shown in FIG. 1), power required to drive the gate of the bottom device can be proportional to the energy stored in a gate to source capacitance in each cycle and the frequency of operation. Each cycle can charge the gate with energy from the power supply, and then this energy can be discharged to ground in each cycle. Power needed to drive the bottom device gate $P_{drive}$ can be proportional to $V_{gs\_max}^2 * f_o * C_{gs}$. In the preceding formula, $V_{gs\_max}$ refers to the maximum voltage between the gate and source of the bottom device, $f_o$ refers to operating frequency, and $C_{gs}$ refers to capacitance between gate and source of the bottom device. The electrical charge and energy driving the middle and top device in the stack can be recirculated (because of capacitors connected to the gates of those devices, in the same manner as previously discussed) and is not necessarily lost in each cycle.

In order to decrease energy lost during the discharge portion of each cycle of oscillation, electrical size W/L of the bottom device can be made smaller than electrical size W/L of the remaining devices. Such configuration can reduce the driving power of the bottom device without reducing output power of the whole stack, thus resulting in larger efficiency. In order words, less power can be consumed to drive the bottom device at the expense of a slightly higher $R_{on}$ (due to lower W/L) of the bottom device.

Figure 10:
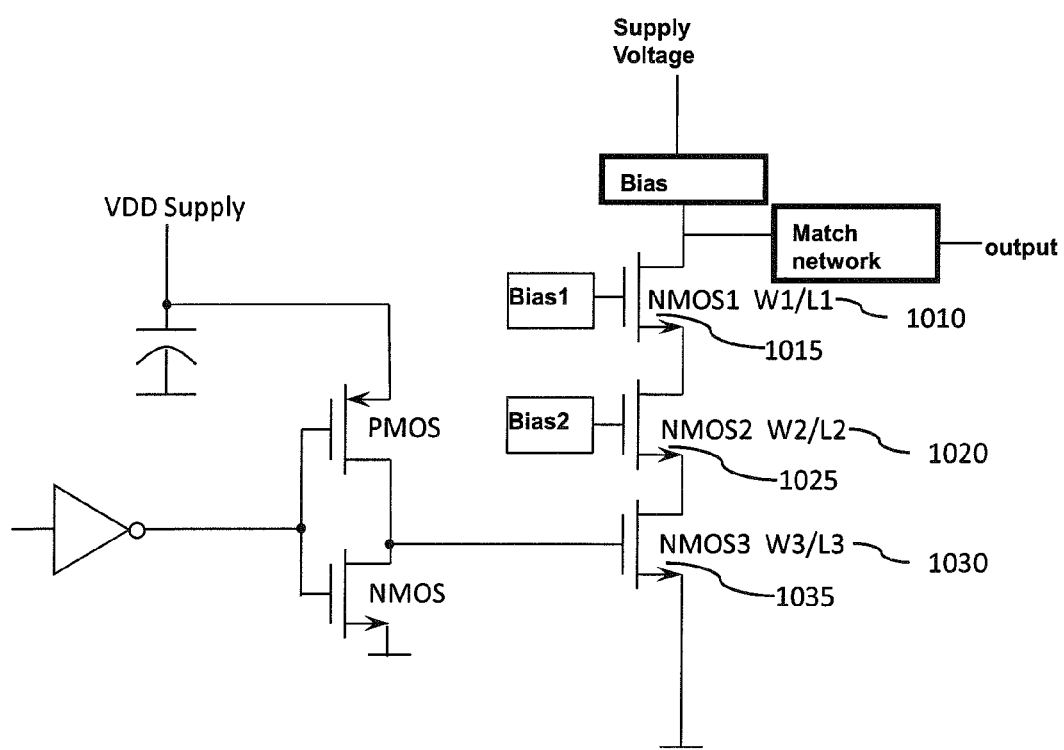
FIG. 10 shows an embodiment of the present disclosure comprising three stacked devices with specified W/L ratios.

FIG. 10 shows an embodiment of the present disclosure comprising three stacked devices (1015, 1025, 1035) with specified W/L ratios (1010, 1020, 1030). According to a first example, all devices (1015, 1025) can have the same W/L (1010, 1020) with the exception of the bottom device (1035), which can have a lower W/L (1030). According to a second example, higher-placed devices can have a higher W/L. In the example embodiment shown in FIG. 10, $W_3/L_3$ (1030) can be less than $W_2/L_2$ (1020) to decrease driving losses of the NMOS3 device (1035). $W_2/L_2$ (1020) can be equal to $W_1/L_1$ (1010) in a most typical case. An improvement in efficiency can be achieved if $W_1/L_1$ (1010)>$W_2/L_2$ (1020)>$W_3/L_3$ (1030). A ratio of 1.1/1.0/0.85 for the W/L ratios of device 1/2/3 (1010/1020/1030), respectively, has been used with good results in a switching amplifier. The improvement is also seen at lower W2/L2 to W3/L3 ratios, however with lower drain efficiency gains, as the applicants found through circuit simulation and optimization. In the above ratio (1.1/1.0/0.85) between W/L electrical sizes of different devices, a value of 1 indicates a baseline value, where the term "baseline" refers to a starting design with all the devices in the stack having the same W/L.

Figure 11A:
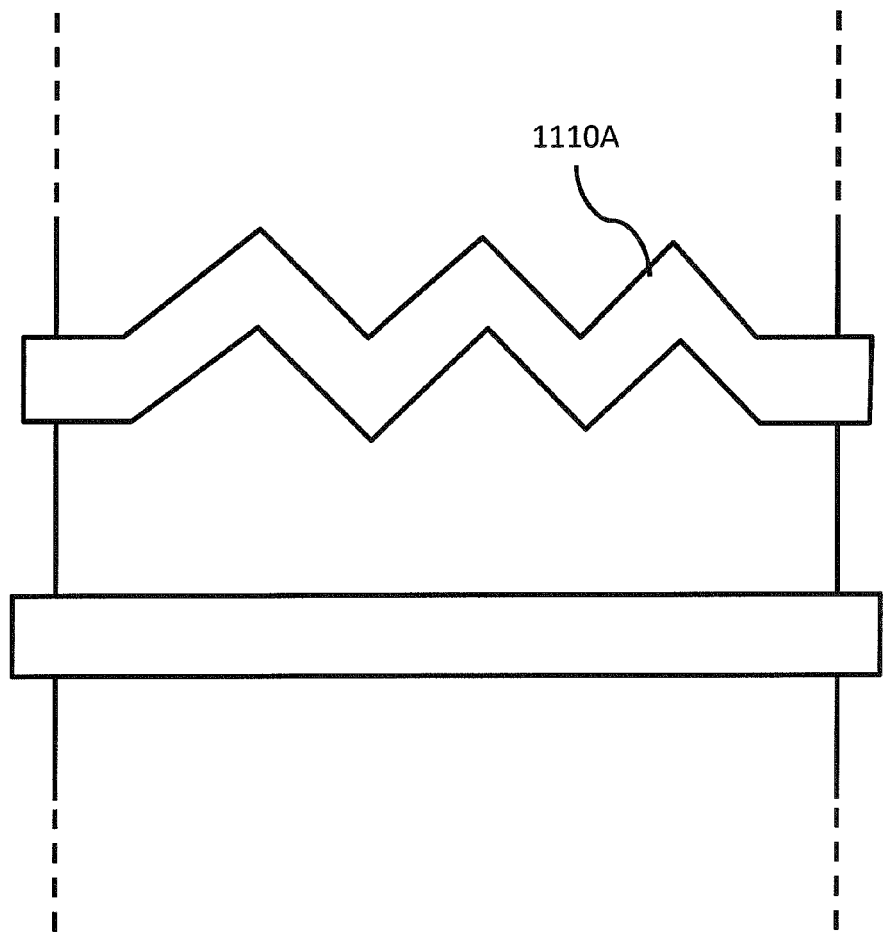
FIGS. 11A and 11B show embodiments of the present disclosure where the W/L size can be changed by changing the effective width W of a device.
Figure 11B:
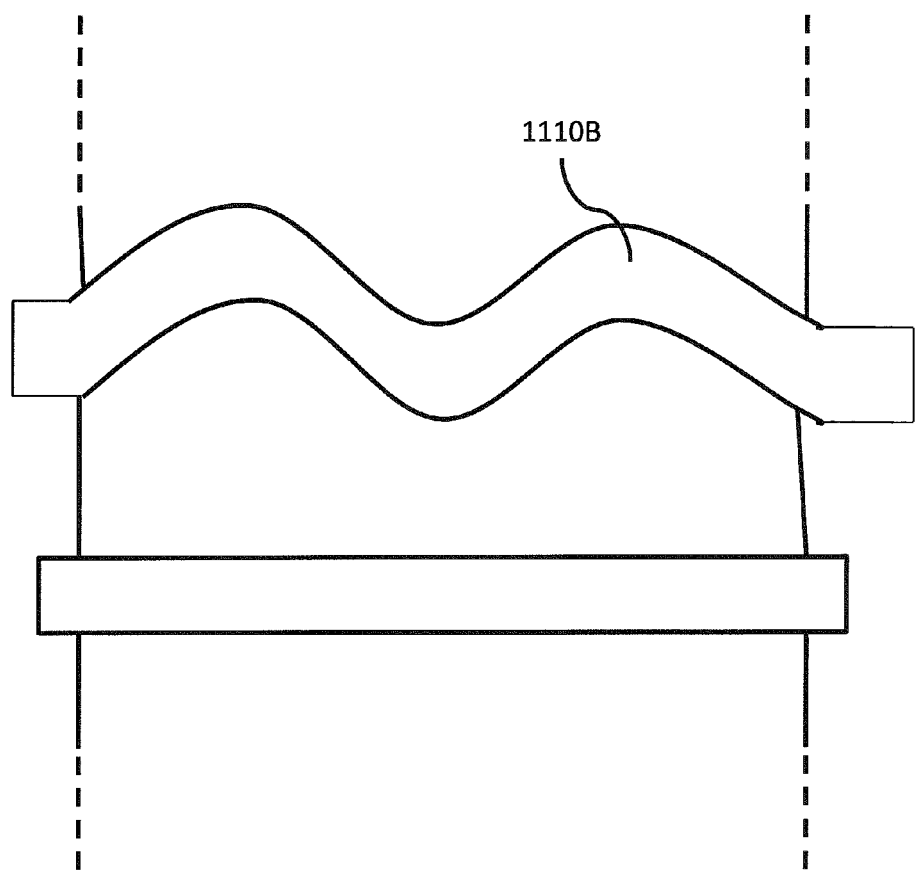

FIGS. 11A and 11B show embodiments of the present disclosure where electrical size W/L can be changed by changing width W of a device. The electrical size W/L can be changed by W, L, or both. While changing L is pretty intuitive, changing W is less trivial, because usually the active area of the stack is not changed. More particularly, although shape of the active area can be adjusted, the active area is usually in a rectangular shape for placement of multiple devices in an array. A possible way of changing width W without changing the active area is shown in FIGS. 11A and 11B, by constructing the gate (1110A, 1110B) of a device with a zigzag shape or wavelike shape. It is noted that specific shape is not important. What is important is that the total effective width is larger because of larger perimeter of the gate along the width of the active area.

Figure 12:
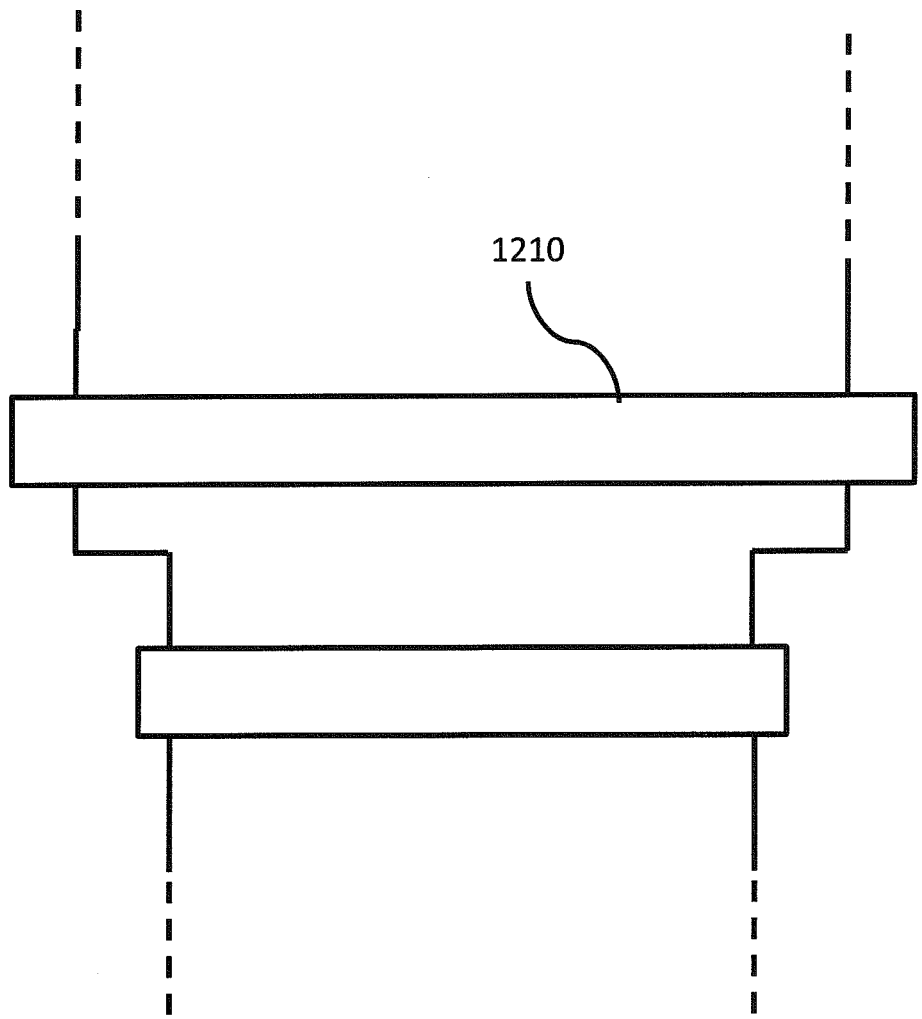
FIG. 12 shows an embodiment of the present disclosure where the W/L size can be changed by changing the width W of a device. This is accomplished by modifying the width of the active area for each of the merged devices.

As previously mentioned, although shape of the active area can be adjusted, the active area is usually in a rectangular shape for placement of multiple devices in an array. However, in an application where shape of the active area can be changed (e.g. nonuniform active area width), W/L size can be changed by changing the width W of a device. Such an embodiment is shown in FIG. 12.

While the examples set forth above focus on using NMOS devices, the person skilled in the art will understand that merged active devices on a common substrate of the present disclosure can also be constructed using PMOS devices with a corresponding reversal of drain and source contacts along with reversal of polarity of any non-zero threshold voltage $V_t$ (e.g. $V_t$=0.7 V for NMOS device becomes $V_t$=−0.7 V for PMOS device) for enhancement type devices. The driving, biasing, merging, and stacking methods discussed in the present disclosure, including device characteristics such as differing threshold voltages, differing oxide thicknesses, differing gate lengths, and differing W/L (width to length) ratios, are also applicable to depletion devices and this should be obvious to the person skilled in the art. A person skilled in the art should be able to apply teachings of the present disclosure to depletion devices without further explanation.

The person skilled in the art will understand that a combined embodiment is also possible, where different individual embodiments are combined together. Various combinations of the individual embodiments presented are possible and can be readily realized by the person skilled in the art. Furthermore, a structure comprised of stacked devices, where the stacked devices are constructed with two or more characteristics chosen from among a group consisting of differing threshold voltages, differing oxide thicknesses, differing gate lengths, and differing W/L (width to length) ratios can also be constructed. Implementation details of such a structure are within the capability of a person skilled in the art.

The example embodiments set forth in the present disclosure can be used in the design and construction of an RF amplifier, an RF power amplifier, a cellular RF power amplifier, a switching RF power amplifier, a CMOS RF power amplifier, a cellular CMOS RF power amplifier, and a switching class E power amplifier, as well as other circuits. By way of example, and not of limitation, devices and methods of the present disclosure may be implement using silicon on insulator technology or, more specifically, silicon on sapphire technology. For example, in several embodiments of the present disclosure, the switching circuitry can be constructed using CMOS technology and various architectures known to the skilled person, such as, for example, the architecture presented in U.S. Pat. No. 7,910,993, issued on Mar. 22, 2011 and entitled "Method and Apparatus for use in Improving Linearity of MOSFET's using an Accumulated Charge Sink", and in U.S. Pat. No. 6,804,502, issued on Oct. 12, 2004 and entitled "Switch Circuit and Method of Switching Radio Frequency Signals", both of which are incorporated herein by reference in their entirety.

The examples set forth above are provided to give those of ordinary skill in the art a complete disclosure and description of how to make and use the embodiments of the merged active devices on a common substrate of the disclosure, and are not intended to limit the scope of what the inventors regard as their disclosure. Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. An arrangement of gates, comprising:
   a plurality of gates corresponding to stacked devices, wherein the stacked devices are stacked across an active area common to the plurality of gates;
   a plurality of conducting channels formed, during operation of the arrangement, underneath each gate from among the plurality of gates;
   a first source contact in correspondence of a first gate from among the plurality of gates;
   a last drain contact in correspondence of a last gate from among the plurality of gates;
   a first drain side of the active area in correspondence of the first gate;
   a last source side of the active area in correspondence of the last gate; and
   one or more drain sides and one or more source sides of the active area, wherein each drain side and each source side is in correspondence of each gate other than the first gate and the last gate and form contiguous regions,
   wherein, during operation of the arrangement, current is adapted to travel through the contiguous regions as well as through the plurality of conducting channels formed underneath each of corresponding gates overlapping the active area, and
   wherein at least one of the stacked devices is different from the other stacked devices.

2. An arrangement of gates, comprising:
   a plurality of gates corresponding to stacked devices, wherein the stacked devices are stacked across an active area common to the plurality of gates;
   a first source contact in correspondence of a first gate from among the plurality of gates;
   a last drain contact in correspondence of a last gate from among the plurality of gates;
   a first drain side of the active area in correspondence of the first gate;

a last source side of the active in correspondence of the last gate; and one or more drain sides and one or more source sides of the active area, wherein each drain side and each source side is in correspondence of each gate other than the first gate and the last gate and form contiguous regions, wherein at least one of the stacked devices is different from the other stacked devices.

3. The arrangement according to claim 1, wherein the contiguous regions are devoid of respective drain contacts and source contacts.

4. The arrangement according to claim 2, wherein the contiguous regions are devoid of respective drain contacts and source contacts.

5. An arrangement, comprising:
   a plurality of N gates corresponding to stacked devices, wherein the stacked devices are stacked across an active area common to the plurality of N gates, wherein N represents an integer, at least one of the stacked devices being different from the other stacked devices;
   a first source contact in correspondence of a first gate $G_1$ from among the plurality of N gates; and
   a last drain contact in correspondence of a last gate $G_N$ from among the plurality of N gates,
   wherein, during operation of the arrangement, current travels between each of the plurality of gates through regions that are located between gates $G_1$ and $G_2$, ..., and between gates $G_{N-1}$ and $G_N$, of the active area common to the plurality of N gates.

6. The arrangement according to claim 2, wherein all stacked devices are of a same type, the same type being chosen from among the group consisting of: n-channel (or NMOS) devices and p-channel (or PMOS) devices.

7. The arrangement according to claim 6 wherein all stacked devices are of a same type, the same type being chosen from among the group consisting of: normal devices and native devices.

8. The arrangement according to claim 2, wherein the at least one of the stacked devices has a different threshold voltage from the other stacked devices.

9. The arrangement according to claim 2, wherein the first gate corresponds to a normal device and other gates correspond to native devices.

10. The arrangement according to claim 9, wherein the first gate corresponds to a normal NMOS device and other gates correspond to native NMOS devices.

11. The arrangement according to claim 2, wherein the at least one of the stacked devices has a different gate oxide thickness' from the other stacked devices.

12. The arrangement according to claim 2, wherein the at least one of the stacked devices has a different gate length from the other stacked devices.

13. The arrangement according to claim 2, wherein the at least one of the stacked devices has a different gate width to length ratio (W/L) from the other stacked devices.

14. The arrangement according to claim 13, wherein the at least one of the stacked devices having a different gate width to length ratio (W/L) from the other stacked devices has a gate with a zigzag or wavelike shape and the other stacked devices have gates with a rectangular shape.

15. The arrangement according to claim 2, wherein the arrangement is characterized by at least two hybrid factors, each hybrid factor being selected from among the group consisting of: different threshold voltage between different devices, different gate oxide thickness between different devices, different gate length between different devices, and different gate width to length (W/L) ratio between different devices.

16. The arrangement according to claim 2, adapted for use in an application selected from among the group consisting of: an RF (radio frequency) amplifier, an RF power amplifier, a cellular RF power amplifier, a switching RF power amplifier, a CMOS (complementary metal oxide semiconductor) RF power amplifier, a cellular CMOS RF power amplifier, and a switching class E power amplifier.

* * * * *